United States Patent
Kang et al.

(10) Patent No.: US 6,829,305 B2
(45) Date of Patent: Dec. 7, 2004

(54) CONCATENATED CONVOLUTIONAL ENCODER AND DECODER OF MOBILE COMMUNICATION SYSTEM

(75) Inventors: Young Hwan Kang, Seoul (KR); Cheol Woo You, Seoul (KR); Jee Woong Seol, Seoul (KR)

(73) Assignee: LG Electronics Inc., Seoul (KR)

( * ) Notice: Subject to any disclaimer, the term of this patent is extended or adjusted under 35 U.S.C. 154(b) by 715 days.

(21) Appl. No.: 09/730,746

(22) Filed: Dec. 7, 2000

(65) Prior Publication Data

US 2001/0009569 A1 Jul. 26, 2001

(30) Foreign Application Priority Data

Dec. 8, 1999  (KR) ......................................... 1999-55783
Feb. 29, 2000 (KR) ......................................... 2000-10166

(51) Int. Cl.[7] ............................................. H04B 14/04
(52) U.S. Cl. ....................................... 375/242; 714/751
(58) Field of Search ................................. 375/242, 265; 714/786

(56) References Cited

U.S. PATENT DOCUMENTS 6,023,783 A * 2/2000 Divsalar et al. ............ 714/792
6,044,116 A * 3/2000 Wang ........................ 375/265
6,263,466 B1 * 7/2001 Hinedi et al. ............... 714/755
6,289,486 B1 * 9/2001 Lee et al. ................... 714/788
6,323,788 B1 * 11/2001 Kim et al. ................... 341/81
6,510,536 B1 * 1/2003 Crozier et al. .............. 714/755

OTHER PUBLICATIONS

"Rate k/(k+1) Minimal Punctured Convolutional Encoders" Hole, Jorgen Kjell IEEE transactions on Information Theory, vol. 37, No. 3 May 1991, p. 653–655.*

* cited by examiner

Primary Examiner—Stephen Chin
Assistant Examiner—Harry Vartanian
(74) Attorney, Agent, or Firm—Lee, Hong, Degerman, Kang & Schmadeka

(57) ABSTRACT

The present invention relates to a concatenated convolutional encoder and decoder for the next generation mobile communication system requiring a high performance channel coding, in particular to a concatenated convolutional encoder and decoder of a mobile communication system which is capable of providing a dual mode encoder and decoder for supporting both a parallel concatenated convolutional code and a serially concatenated convolutional code and improving the performance of the system by using punctured and thrown away sequence in a convolutional encoder. The present invention can show stable performance regardless of SNR, accordingly the credibility of the system can increase.

6 Claims, 13 Drawing Sheets

CONCATENATED CONVOLUTIONAL ENCODER AND DECODER OF MOBILE COMMUNICATION SYSTEM

CROSS-REFERENCE TO RELATED APPLICATIONS

Pursuant to 35 U.S.C. §119(a), this application claims the benefit of earlier filing date and right of priority to Korean Application Nos. 55783/1999, filed on Dec. 8, 1999 and 10166/2000, filed on Feb. 29, 2000, the contents of which are hereby incorporated by reference herein in their entirety.

BACKGROUND OF THE INVENTION

1. Field of the Invention

The present invention relates to a encoder and a decoder considered for the next generation mobile communication system requiring high channel coding performance, in particular to a concatenated convolutional encoder and a decoder of a mobile communication system which is capable of providing a dual mode encoder and a decoder for supporting both a parallel concatenated convolutional code and a serially concatenated convolutional code and improving the performance of the system by using punctured and thrown away sequence in a convolutional encoder.

2. Description of the Prior Art

In a mobile communication system according to the conventional technology, a turbo encoder showing high performance is used for low SNR (Signal to Noise Ratio).

The turbo encoder comprises a parallel concatenated convolutional encoder and a serially concatenated convolutional encoder.

Between them, the serially concatenated convolutional encoder showing continual performance improvement stood in the spotlight because the parallel concatenated convolutional encoder shows a performance saturation phenomenon in high SNR.

The serially concatenated convolutional encoder will now be described with reference to accompanying FIG. 1.

FIG. 1 is a construction profile illustrating the conventional serially concatenated convolutional encoder of the mobile communication system.

As depicted in FIG. 1, the conventional serially 3 of the mobile communication system comprises a first RSC (Recursive Systematic Convolutional) encoder 11 for coding an inputted data sequence DO with ½ code rate, a puncturer 12 for puncturing a code outputted from the first RSC encoder 11 with a puncturing pattern 1110 and outputting it, an interleaver 13 for lowering correlation between adjacent data by relocating position of the code outputted from the puncturer 12 after being punctured, and a second RSC encoder 14 for decoding the code relocated by the interleaver 13 with the ½ decode rate and outputting the final code CO.

The operation will now be described in detail.

First, when the data sequence DO is inputted to the first RSC encoder 11 the first RSC encoder 11 codes the inputted data sequence DO with ½ code rate, generates two new sequences and outputs them. Herein, the two sequences outputted from the first RSC encoder 11 are combined as one sequence by a switch (not shown), and is provided to the puncturer 12.

After that, the puncturer 12 punctures the sequence outputted from the first RSC encoder 11 with the puncturing pattern 1110, and outputs it to the interleaver 13.

Herein, in the puncturing pattern 1110, "1" means the data outputted from the first RSC encoder 11 is outputted to the interleaver 13 as it is, and "0" means the data outputted from the first RSC encoder 11 is punctured, in other words, it is thrown away.

After all, when 4 bits data is outputted from the first RSC encoder 11, the fourth data is thrown away (punctured), and the rest 3 bits are passed.

In addition, the interleaver 13 randomly relocates the data punctured on the multiple proportion bit of 4, reads it to a column direction, and outputs it. Accordingly the interleaver can lower the correlation between the adjacent codes and outputs it to the second RSC encoder 14.

The second RSC encoder 14 codes the code outputted from the interleaver 13 with ½ code rate, generates new two sequences, and outputs them. Herein, the outputted two sequences are added by a switch (not shown) as one sequence, and is outputted as a final coded code CO.

Herein, in the conventional serially concatenated convolutional encoder, a encoder of which constraint length is 3 and ½ code rate is used, the first RSC encoder 11 and second RSC encoder 14 use the encoder having same construction.

Meanwhile, the conventional parallel concatenated convolutional encoder comprises two RSC encoders and an interleaver. In other words, in the conventional coding technology, after the input sequence of the first convolutional encoder is relocated through the interleaver, the sequence is used as an input sequence of the second convolutional encoder.

Accordingly, because only data part of the output of the first convolutional encoder can be provided to the input of the second convolutional encoder, the system performance lowering problem occurs in the SNR increasing region, accordingly the credibility of the system lowers due to that.

As described above in detail, in the conventional technology, the input sequence of the first convolutional encoder and second convolutional encoder have same weight values, in partucular when the weight value is 2, a code having low weight value about a certain sequence pattern is generated according to the characteristic of the RSC encoder.

In addition, in the conventional technology, because only data part of the output of the first convolutional encoder can be provided to the input of the second convolutional encoder, accordingly the sudden performance lowering problem occurs in the high SNR region.

In addition, in the conventional technology, because the sudden performance lowering problem occurs in the SNR increasing region, accordingly there is a credibility lowering problem due to that.

In addition, in the conventional technology, in the parallel concatenated convolutional encoder, extrinsic information transmitted/received between the each module in iterative decoding only deals with information about the input sequence to the exclusion of information about parity sequence.

In addition, in the conventional technology, the performance of the system lowers due to the sequence punctured by the serially concatenated convolutional encoder.

SUMMARY OF THE INVENTION

Accordingly, the object of the present invention is to provide a concatenated convolutional encoder and a decoder of a mobile communication system which is capable of improving performance of the system by using sequence punctured inside of a encoder.

The other object of the present invention is to provide a concatenated convolutional encoder and a decoder of a mobile communication system which is capable of providing a serially convolutional encoder structure having same construction with a parallel concatenated convolutional encoder used in the next generation communication system.

The another object of the present invention is to provide a concatenated convolutional encoder and a decoder of a mobile communication system which is capable of providing single form structure usable as a serially concatenated convolutional encoder and a parallel concatenated convolutional encoder as occasion demands.

The another object of the present invention is to provide a concatenated convolutional encoder and a decoder of a mobile communication system which is capable of multiplexing the output data and parity bit of the first convolutional encoder with an appropriate rate and providing it as an input of the next terminal convolutional encoder.

The another object of the present invention is to provide a concatenated convolutional encoder and a decoder of a mobile communication system which is capable of showing stable performance regardless of SNR fluctuation by setting weight value of the input sequence of the parallel convolutional encoder different from the weight value of the first convolutional encoder in the parallel concatenated convolutional encoder.

In order to achieve the above-mentioned objects, in the concatenated convolutional encoder of the mobile communication system according to the present invention, a serially concatenated convolutional encoder of a mobile communication system for coding an inputted code by puncturing comprises a puncturer for puncturing the inputted code with a certain puncturing pattern, an interleaver for lowering correlation between adjacent bits by relocating position of the code punctured from the puncturer, a first RSC encoder for coding the code outputted from the interleaver with 1/n code rate and outputting it, a delayer for delaying the inputted code punctured and thrown away from the puncturer for a certain time, and a substituent for substituting the punctured code delayed on the delayer for the code on the punctured position when it is inputted among the codes outputted from the first RSC encoder and outputting it.

In order to achieve the above-mentioned objects, a serially concatenated convolutional decoder of a mobile communication system according to the present invention comprises a demux (demultiplexer) and zero inserter for inserting zero on the position of a substituted code bit when the substituted code bit is inputted and outputting it while outputting received code bits, and outputting the substituted code bit to the multiplexer, an inner SISO input unit for generating a decode value by adapting the outputted code bit and a probability value fed-back from an output terminal to a maximum probability decode algorithm, a deinterleaver for deinterleaving the generated decode value, a multiplexer for inserting the substituted code bit into the decode value outputted from the deinterleaver and outputting it, and an outer SISO output unit for generating the final decode value by adapting the decode value having the inserted substituted code bit and probability value of the zero to the maximum probability decode algorithm.

In order to achieve the above-mentioned objects of the present invention, a dual mode concatenated convolutional encoder of a mobile communication system according to the present invention comprises a first RSC encoder for coding inputted data sequence with 1/n code rate, a puncturer for puncturing the code outputted from the first RSC encoder with a certain puncturing pattern, an interleaver for dispersing errors clustered on one code by relocating position of the punctured code, a second RSC encoder for outputting new two code values by coding the error dispersed code with 1/n code rate, a delayer for delaying the code punctured and thrown away from the puncturer for a certain time, a substituent for substituting the punctured code delayed on the delayer for the code on the punctured position when it is inputted among the codes outputted from the second RSC encoder, and outputting it, and a switch for connecting the output of the second RSC encoder and delayer to the substituent in a serial coding mode and connecting directly the output of the second RSC encoder and delayer to an output terminal side in a parallel coding mode.

In order to achieve the above-mentioned objects of the present invention, a decoder of a mobile communication system according to the present invention comprises an encoder for coding input data and outputting it as a code word form, a sequence splitter for outputting a plurality of sequences by splitting the code word, an interleaver for relocating the inputted sequence transmitted as it is among the plurality of the sequences and the rest sequences as a random form, and a certain number of encoder, sequence splitter, interleaver for operating same with the encoder, sequence splitter, interleaver by being dependently connected to an output terminal of the interleaver as many as they are required.

DETAILED DESCRIPTION OF THE PREFERRED EMBODIMENT

Figure 2:
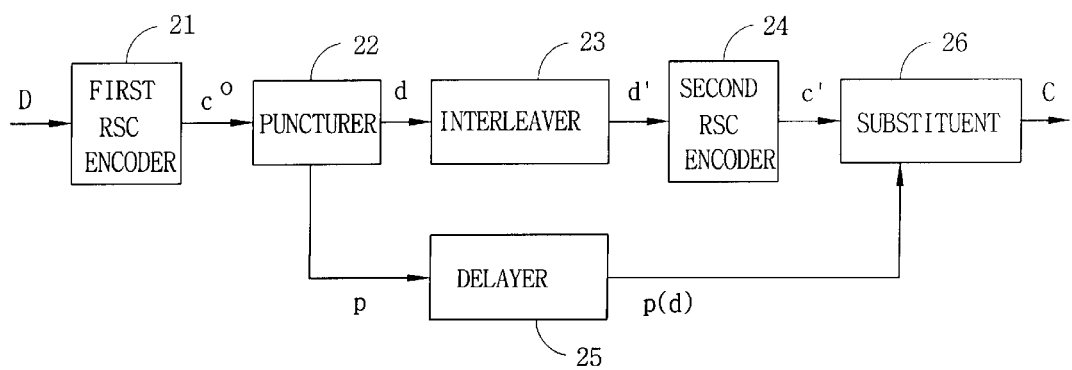
FIG. 2 illustrates the embodiment of a serially concatenated convolutional encoder of the next generation mobile communication system in accordance with the present invention.

FIG. 2 illustrates the embodiment of a serially concatenated convolutional encoder of the next generation mobile communication system according to the present invention.

As depicted in FIG. 2, the present invention comprises a first RSC (Recursive Systematic Convolutional) encoder 21 for coding the inputted data sequence D with 1/n code rate, a puncturer 22 for puncturing the code outputted from the first RSC encoder 21 with a puncturing pattern 1110, an interleaver 23 for lowering correlation between the adjacent codes by relocating the position of the code punctured and outputted from the puncturer 22, a second RSC (Recursive Systematic Convolutional) encoder 24 for coding the code outputted from the interleaver 23 with 1/n code rate and outputting it, a delayer 25 for being inputted the punctured code thrown away from the puncturer 22 and delaying it for a certain time, and a substituent 26 for substituting the delayed punctured code outputted from the delayer 25 for the punctured position code among the codes outputted from the first RSC (Recursive Systematic Convolutional) encoder and outputting it.

The operation and effect of the present invention will now be described in detail with reference to accompanying FIGS. 3A, 3B and 4.

First, when input data sequence D is inputted to the first RSC (Recursive Systematic Convolutional) encoder 21, the first RSC encoder 21 generates new two sequences by coding the inputted data sequence with 1/n code rate, and outputs them.

Herein, the outputted two sequences are added as one sequence $C^o$ by a switch (not shown) and is outputted to the puncturer 22.

The puncturer 22 separately outputs the sequence $C^o$ outputted from the first RSC encoder to the interleaver 23 and delayer 25 with the puncturing pattern 1110.

Figure 3A:
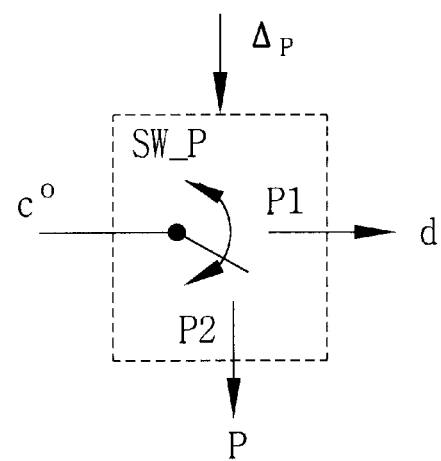
FIG. 3A illustrates a detailed construction of a puncturer of FIG. 2 in accordance with the present invention.

After that, as depicted in FIG. 3A, when the puncturing pattern is 1, a switch SW_P is placed on P1 position, the puncturer 22 outputs the sequence $C^o$ to the interleaver 23. On the contrary, when the puncturing pattern is 0, the switch SW_P is placed on P2 position, the puncturer 22 outputs the sequence $C^o$ to the delayer 25.

Herein, FIG. 3A illustrates a detailed construction of the puncturer 22 of FIG. 2.

As depicted in FIG. 3, when the code to be punctured p is inputted to the puncturer 22 while the puncturer 22 outputs the code of the first RSC (Recursive Systematic Convolutional) encoder 21 to the interleaver 23, the puncturer 22 outputs the code to be punctured p to the delayer 25.

After that, the delayer 25 delays the code to be punctured p for a certain time, and outputs the delayed code p(d) to the substituent 26.

Meanwhile, the interleaver 23 interleaves the codes outputted from the puncturer 22, disperses cluster errors and provides it to the second RSC (Recursive Systematic Convolutional) encoder 24.

When the second RSC encoder 24 codes it with ½ code rate, generates new two sequences, and outputs them to the substituent 26, the two sequences are added as one sequence c' by a switch (not shown), and is outputted to the substituent 26.

Figure 3B:
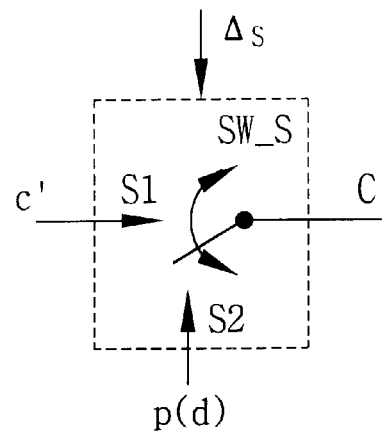
FIG. 3B illustrates a detailed construction of a substituent of FIG. 2 in accordance with the present invention.

As depicted in FIG. 3B, when substituent pattern Δs is 1, the switch SW_S is placed on S1 position, accordingly the substituent 26 outputs the code c' outputted from the second RSC encoder 24 as the final code bit C.

In addition, when the substituent pattern Δs is 0, the switch SW_S is placed on S2 position, accordingly the substituent 26 substitutes it with the puncturing bit p(d) outputted through the delayer 25 and outputs it.

Herein, FIG. 3B illustrates a detailed construction of the substitutuent of FIG. 2.

Figure 4:
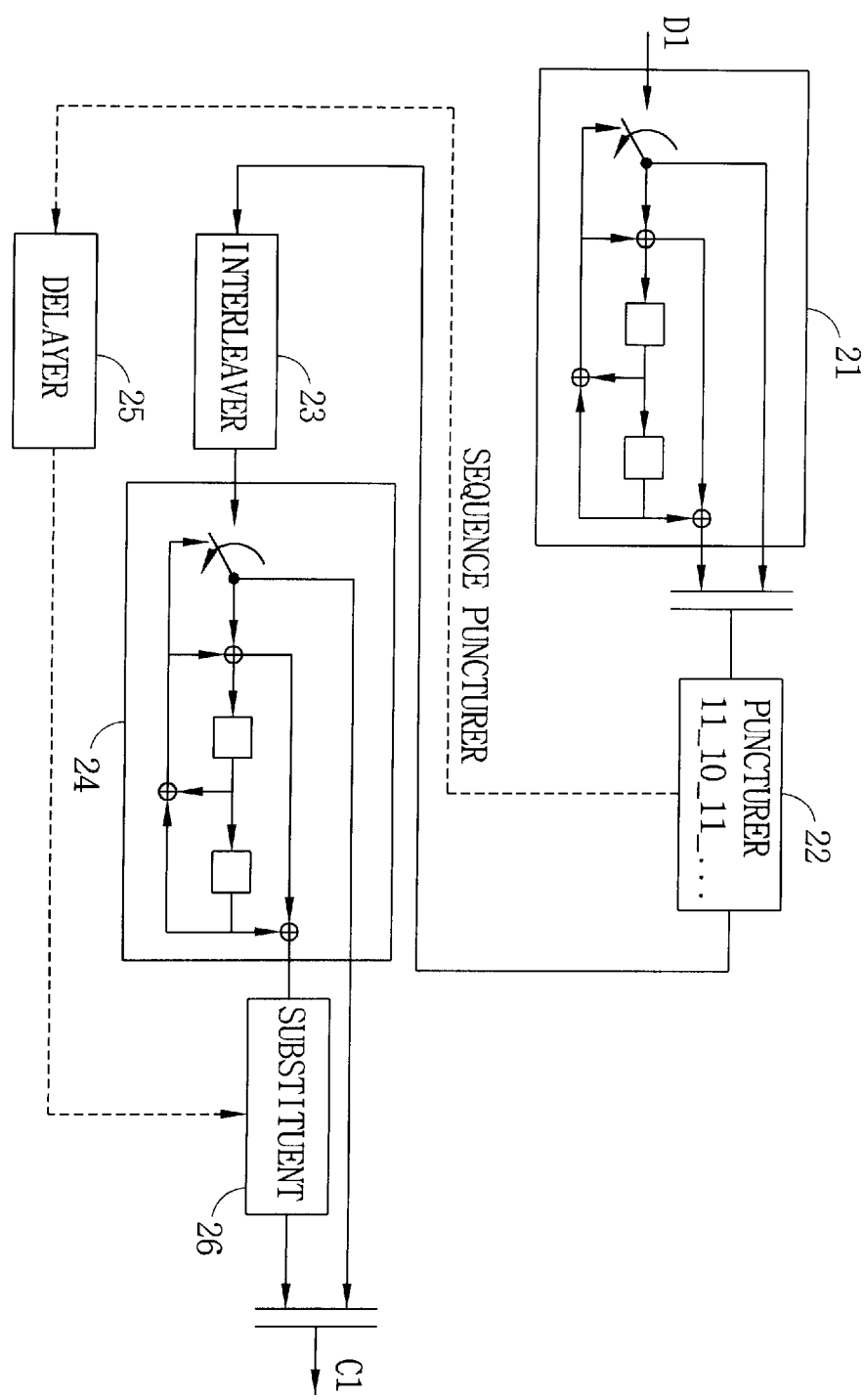
FIG. 4 illustrates FIG. 2 in more detail.

FIG. 4 illustrates FIG. 2 in detail, as depicted in FIG. 4, same two encoders having constraint length 3 and ½ code rate are used for the first RSC encoder 21 and second RSC encoder 24.

Between the two encoders, the performance of the coding is determined by the code bit of the first RSC encoder 21.

Accordingly, when 25% sequence punctured and thrown away through the puncturer 22 are substituted on the designated position and outputted by using the delayer 25 and substituent 26, the performance of the system improves.

Figure 5:
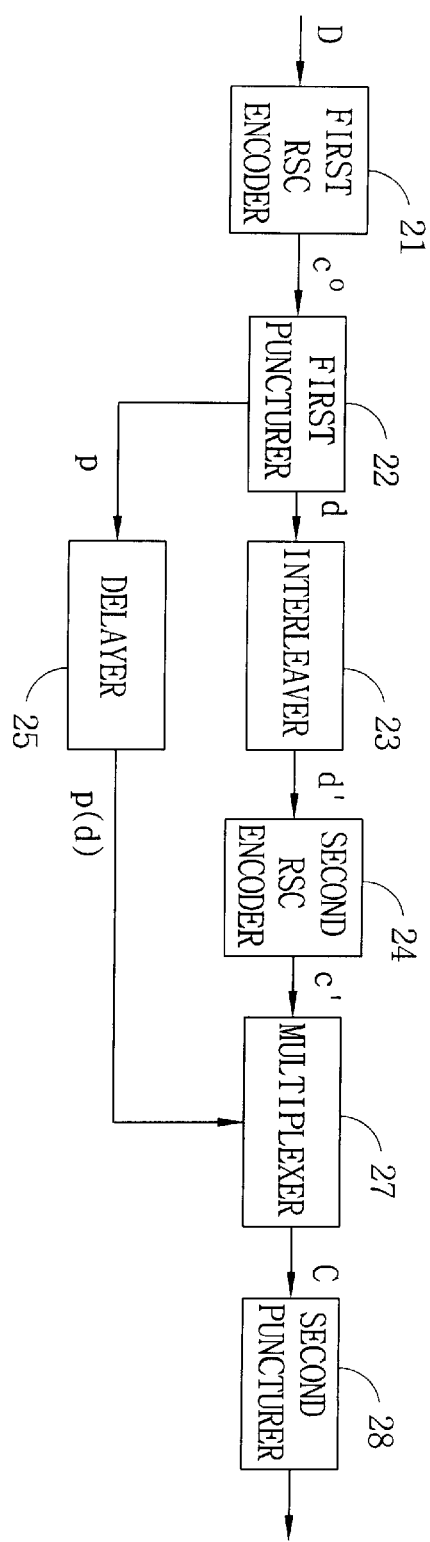
FIG. 5 is a block diagram illustrating the other embodiment of a serially concatenated convolutional encoder of the next generation mobile communication system in accordance with the present invention.

FIG. 5 is a block diagram illustrating the other embodiment of a serially concatenated convolutional encoder of the next generation mobile communication system according to the present invention.

As depicted in FIG. 5, the other embodiment of the present invention comprises a first RSC (Recursive Systematic Convolutional) encoder 21 for coding the inputted data sequence D with ½ code rate, a first puncturer 22 for puncturing the code outputted from the first RSC encoder 21 with the puncturing pattern 1110, an interleaver 23 for lowering correlation between the adjacent bits by relocating the position of the code punctured by the puncturer 22, a second RSC encoder 24 for coding the code outputted from the interleaver 23 with ½ code rate and outputting it, a delayer 25 for being inputted the punctured code thrown away from the puncturer 22 and delaying it for a certain time, a multiplexer 27 for selecting and outputting the puncture bit when the puncture bit is inputted from the delayer 25 while selecting and outputting the coded bit outputted from the second RSC (Recursive Systematic Convolutional) encoder 24, a second puncturer 28 for outputting the final code by puncturing the puncture bit selected and outputted from the multiplexer 27 as same as the number of the puncture bit punctured on the first puncturer 22. The other embodiment of the present invention uses the multiplexer and puncturer on the behalf of the substituent of the serially concatenated convolutional encoder of FIG. 2, its operation will now be described in detail.

The operation of the first RSC (Recursive Systematic Convolutional) encoder 21, puncturer 22, interleaver 23, the second RSC (Recursive Systematic Convolutional) encoder 24 and delayer 25 are same as the operation of FIG. 2, accordingly the explanation will now be abridged.

First, when the bit c' coded on the second RSC encoder 24 is inputted to the multiplexer 27, the multiplexer 27 outputs the coded bit c' to the second puncturer 28.

Meanwhile, when the puncture bit p(d) delayed for a certain time in the delayer 25 is inputted, the multiplexer 27 adds the puncture bit p(d) outputted from the delayer 25 and outputs it to the second puncturer 28.

In order to match the overall code rate, the second puncturer 28 punctures it as same as the bit number punctured on the first puncturer 22, and outputs it.

Figure 6:
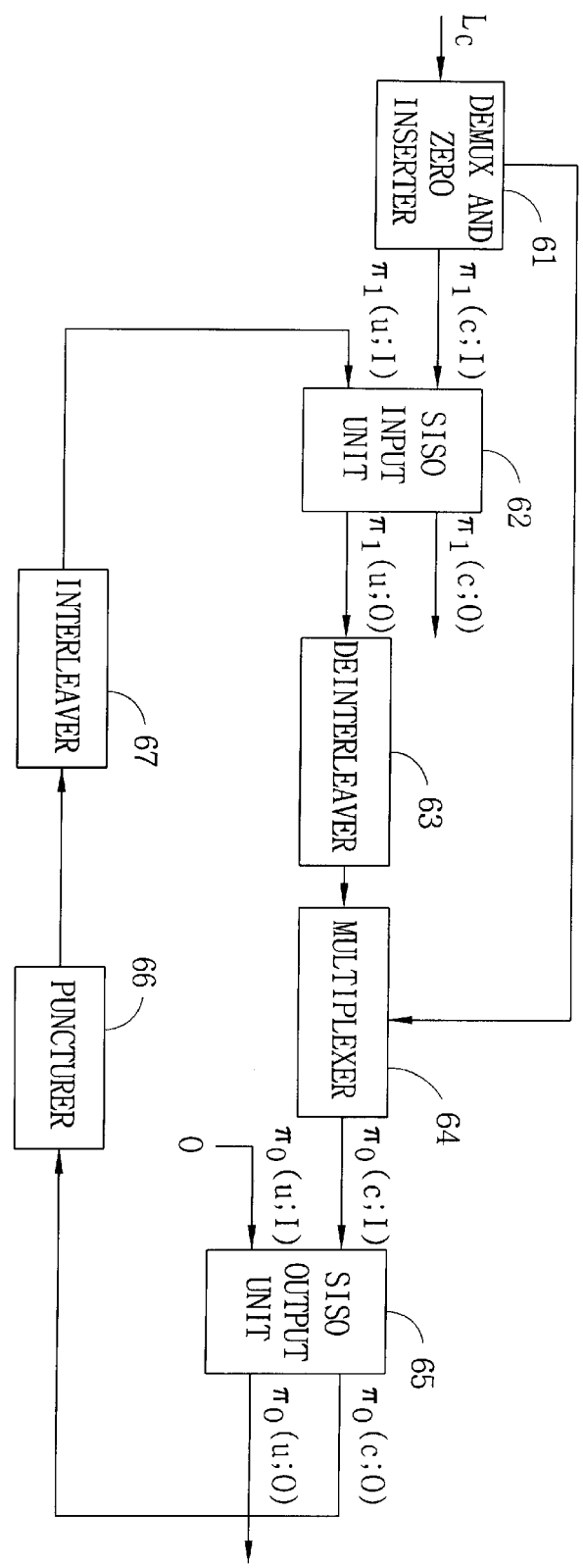
FIG. 6 is a block diagram illustrating the another embodiment of a serially concatenated convolutional decoder of the next mobile communication system in accordance with the present invention.

FIG. 6 is a block diagram illustrating the another embodiment of a serially concatenated convolutional decoder of the next mobile communication system according to the present invention. In other words, the code generated in FIG. 2 or FIG. 5 is modulated and transmitted through the communication channel, when the code modulated through the channel is transmitted, it is decoded by the serially concatenated convolutional decoder of FIG. 6.

As depicted in FIG. 6, the another embodiment of the present invention comprises a demux (demultiplexer) and zero inserter 61 for outputting the received code as it is in the parallel decoding mode, providing the inputted substituent code to the multiplexer in the serial decoding mode, and inserting zero into the substituent code position and outputting, a SISO (soft In Soft Out) input unit 62 for generating decode value by applying the outputted code bit and probability value feedbacked from the output terminal to the maximum probability decode algorithm, a deinterleaver 63 for deinterleaving and outputting the generated decode value, a multiplexer 64 for inserting the substituted code into the decode value outputted from the deinterleaver or selecting the puncture bit and outputting it, and an outer SISO output unit 65 for generating the final decode value by adapting the decode value having the inserted substituted code or a probability value as a code value $\pi_0$ (c;I) and a zero value $\pi_0$ (u;I) provided from the puncture bit and deinterleaver to the maximum probability decode algorithm, a puncturer 66 for puncturing the decode value outputted from the outer SISO output unit with the puncturing pattern, and an interleaver 67 for improving the decode performance by interleaving the decode value punctured from the puncturer and providing it to the inner side SISO input unit as a probability value.

Its operation will now be described in detail.

First, among the receiving decoded bits, when the substituent bit Lc placed on the substituated position is inputted, the substituent bit Lc is transmitted to the multiplexer 64, '0' is inserted into the position on the behalf of the substituent bit Lc, the inserted code bit $\pi_1$ (c,I) is outputted to the inner SISO input unit 62.

After that, the inner SISO input unit 62 is inputted the probability value $\pi_1$ (u,I) inputted to the other input terminal, generates a coded value by using the maximum probability decode algorithm having a viterbi algorithm form, and outputs the generated two values $\pi_1$ (c,0), $\pi_1$ (u,0). Between them, the code value $\pi_1$ (c,0) is non-used value, the code value $\pi_1$ (u,0) is using value, and the code value $\pi_1$ (u,0) is outputted to the deinterleaver 63.

The interleaver 63 deinterleaves the inputted code value $\pi_1$ (u,0), and provides it to the multiplexer 64.

The multiplexer 64 provides the value $\pi_0$ (c,I) generated by inserting the bit ouputted from the demux and zero inserter 61 into the code information provided from the deinterleaver 63 to the outer SISO output unit 65. I other words, the value is inserted into the puncture position of the puncturer.

Herein, the zero (0) probability value $\pi_0$ (u,I) is inputted to the other input terminal of the outer SISO output unit 65 as the other input terminal.

According to this, the outer SISO output unit 65 decodes the probability value $\pi_0$ (c,I) as the original value by using the maximum probability decode algorithm as same as the inside SISO input unit 62, and outputs the decoded value $\pi_0$ (c,0) to the puncturer 66.

The puncturer 66 punctures the decoded value $\pi_0$ (c,0) with the puncturing pattern 1110 and outputs it to the interleaver 67, the interleaver 67 outputs the value found by being inputted the punctured decoded value from the puncturer and interleaving it to the inner SISO input unit 62 as the probability value $\pi_1$ (u,I) of the inner SISO input unit 62.

And, the inner SISO input unit 62, deinterleaver 63, multiplexer 64, outer SISO output unit 65, puncturer 66 and interleaver 67 repeatedly perform the decoding process, accordingly the performance of the system can improve.

Figure 1:
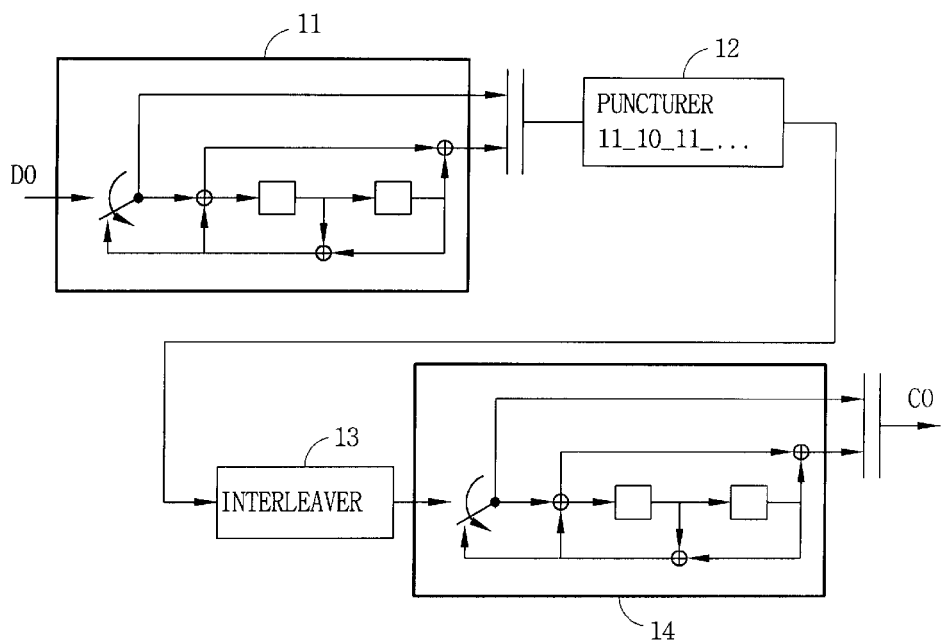
FIG. 1 is a construction profile illustrating the conventional serially concatenated convolutional encoder of a mobile communication system.

As described above, when the parallel concatenated convolutional encoder is used in the next generation mobile communication system, the RSC encoder having the constraint length 4 and ½ code rate is used, when it is adapted to the serially concatenated convolutional encoder of FIG. 1, the performance of the system lowers.

Figure 7:
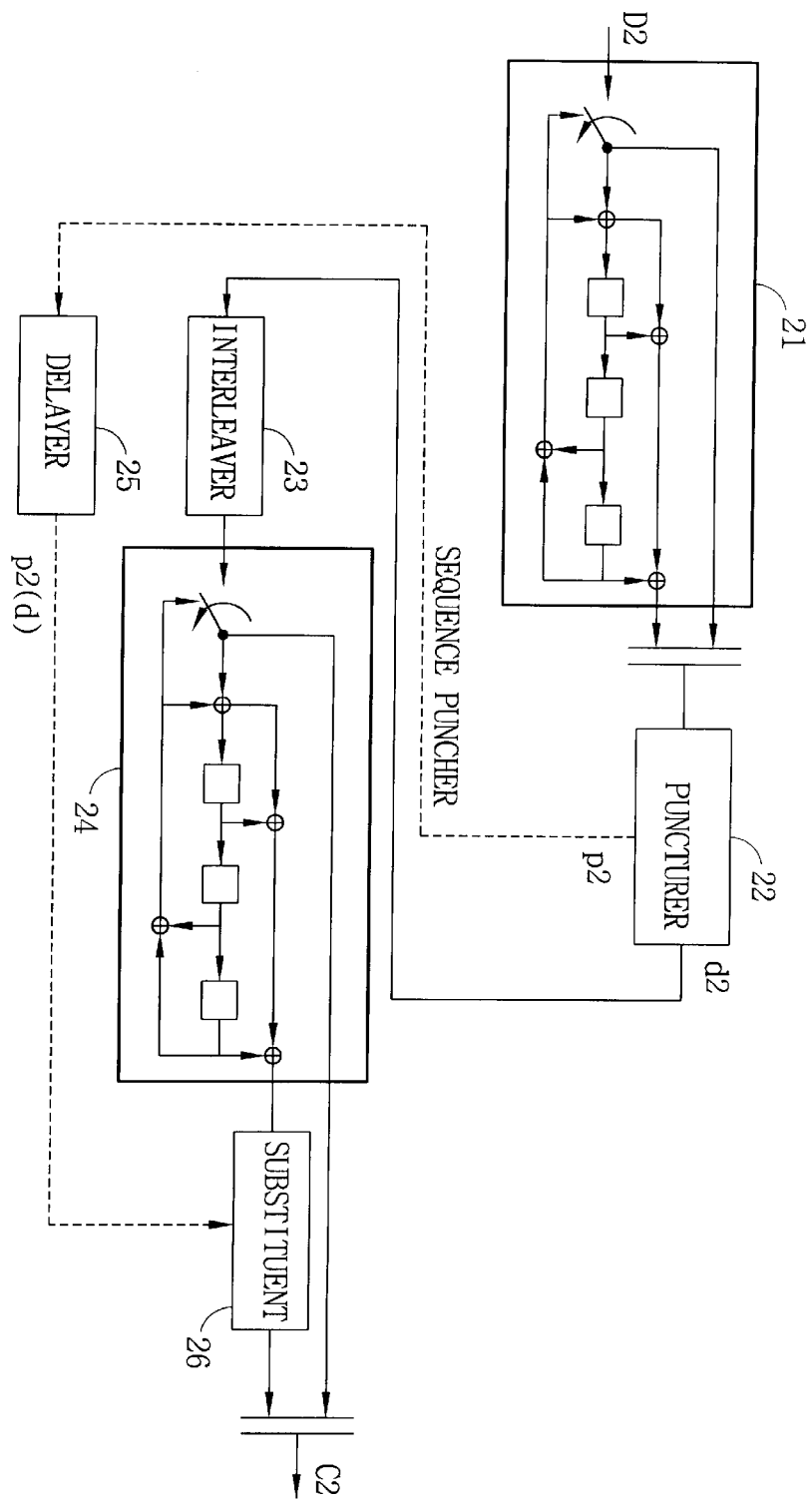
FIG. 7 is a construction profile illustrating a serially concatenated convolutional encoder adapting a RSC encoder having constraint length 4 and ½ code rate used in a parallel concatenated convolutional encoder.

However, as depicted in FIG. 7, when the RSC encoder is adapted to the serial concatenated convolutional encoder comprising the delayer and substituent, the complexity of the system increases, however the performance is improved.

FIG. 7 is a construction profile illustrating a serially concatenated convolutional encoder adapting a RSC encoder having constraint length 4 and ½ code rate used in a parallel concatenated convolutional encoder. The explanation is same with the explanation of FIG. 4, accordingly it will be abridged.

Figure 8:
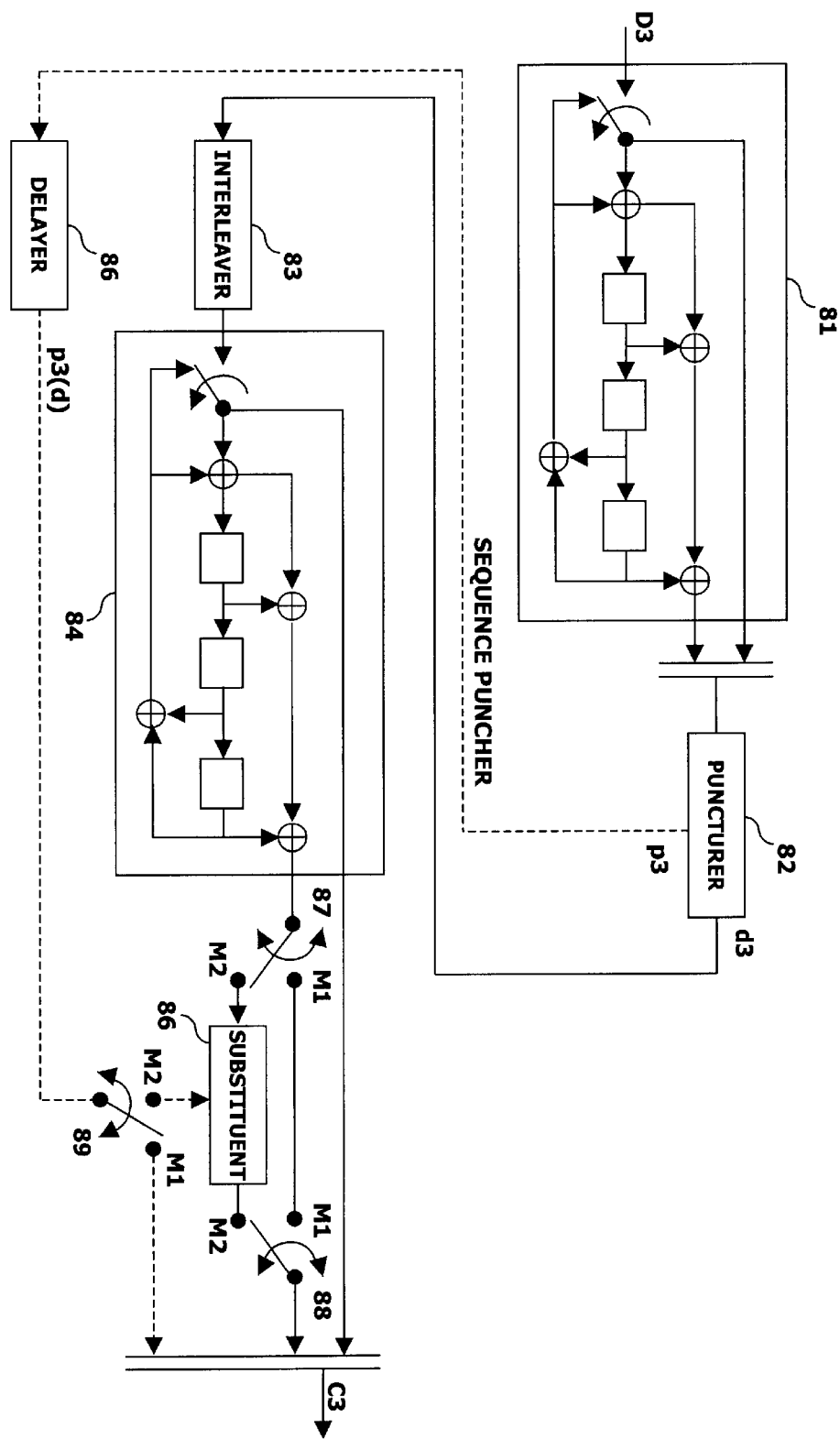
FIG. 8 is a construction profile illustrating a dual mode concatenated convolutional encoder in accordance with the present invention which is usable as a parallel concatenated convolutional encoder or a serially concatenated convolutional encoder.

As depicted in FIG. 7, because the RSC encoder having constraint length 4 and code rate ½ used in the parallel encoder can be adapted to the serially concatenated convolutional encoder, as depicted in FIG. 8, the dual mode concatenated convolutional encoder comprising both the parallel concatenated convolutional encoder and serially concatenated convolutional encoder can be constructed.

FIG. 8 is a construction profile illustrating a dual mode concatenated convolutional encoder in accordance with the present invention which is usable as a parallel concatenated convolutional encoder or a serially concatenated convolutional encoder.

As depicted in FIG. 8, the operation of the dual mode concatenated convolutional encoder which is capable of operating as the parallel concatenated convolutional encoder or serially concatenated convolutional encoder will now be described in detail.

First, the operating process of the parallel concatenated convolutional encoder of the dual mode concatenated convolutional encoder will now be described as below.

First, when the input data sequence D3 is inputted, the first RSC encoder 81 codes it with ½ code rate, generates new two sequences, and outputs them to the puncturer 82.

Herein, the outputted two sequences are added into one sequence by a switch (not shown), and is outputted to the puncturer 82

Herein, the first RSC encoder is the encoder having the 4 constraint length.

The puncturer 82 punctures the sequence outputted from the first RSC encoder 81 with the set puncturing pattern.

Herein, when the puncturing pattern is 1, the first RSC encoder 81 outputs the decoded bit d3 to the interleaver 83, when the puncturing pattern is 0, the bit p3 punctured and thrown away is outputted to the delayer 86.

After that, the delayer 86 delays the bit p3 punctured and thrown away for a certain time and outputs the delayed bit p3(d), the interleaver 83 performs the interleaving of the codes punctured on the puncturer 82 and outputs them to the second RSC encoder 84.

The second RSC encoder 84 codes again the interleaved codes with the ½ code rate, generates new two sequences, and outputs them. Herein, an adjustable terminal of the first~third switches 87~89 is placed on the M1.

And, the two sequences outputted from the second RSC encoder 84 and the sequence outputted from the delayer 86 are outputted.

Meanwhile, when the dual mode concatenated convolutional encoder operates as the serially concatenated convolutional encoder, the adjustable terminal of the first~three switch 87~89 is placed on the M2.

Accordingly, between the new two sequences decoded and outputted from the second RSC encoder 84, the one is outputted as it is, and the other is inputted to the substituent 86.

The substituent 86 substitutes the pertinent position bit for the delay bit p3(d) outputted from the delayer 86 with the substituting pattern, and outputs it.

The outputted two sequences are add into the one sequence by the switch (not shown), and is outputted.

When the dual mode concatenated convolutional encoder is operated as the serially concatenated convolutional encoder, the second RSC encoder 84 has to operate 1.5 times faster than the first RSC encoder 81.

As described above, in the dual mode concatenated convolutional encoder can operate as both the serially concatenated convolutional encoder and parallel concatenated convolutional encoder, the decoder for decoding the code bit outputted from the dual mode concatenated convolutional encoder operating as the serial concatenated convolutional encoder or parallel convolutional encoder will now be described in detail.

Figure 9:
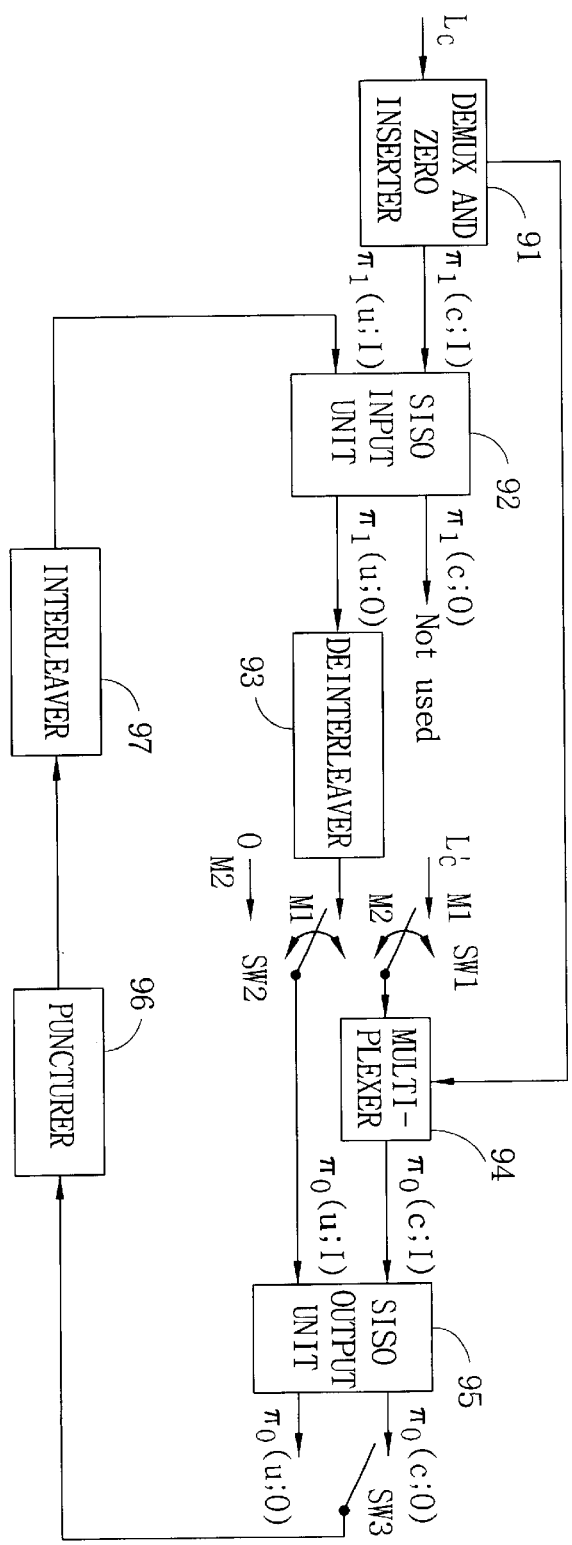
FIG. 9 is construction profile illustrating a dual mode concatenated convolutional decoder for decoding a coded code transmitted from the dual mode concatenated convolutional encoder of FIG. 8.

FIG. 9 is construction profile a dual mode concatenated convolutional decoder decoding a coded code transmitted from the dual mode concatenated convolutional encoder of FIG. 8.

As depicted in FIG. 9, when the code bit decoded through the parallel concatenated convolutional encoder is inputted, a demux and zero inserter 91 outputs the inputted code bit as it is to an inner SISO (Soft In Soft Out) input unit 92. Herein, the probability value $\pi_1$ (u,l) is inputted to the other input terminal of the inner SISO input unit 92.

The inner SISO input unit 92 is inputted the probability value $\pi_1$ (u,l) inputted to the the other input terminal, generates two decode values $\pi_1$ (c,0), $\pi_1$ (u,0) by using the maximum probability decode algorithm having the viterbi algorithm form, and outputs them.

Between the generated decode values, decode value $\pi_1$ (c,0) is not used and the other decode value $\pi_1$ (u,0) is provided to a deinterleaver 93, and the deinterleaver performs the deinterleaving and outputs it.

When the dual mode concatenated convolutional encoder operates as the parallel concatenated convolutional encoder, the adjustable terminal of the first and second switch SW1, SW2 are separately connected to the M1 terminal.

Accordingly, the multiplexer 94 selects the punctured and thrown away puncture bit L'c in order to insert it into the pertinent position, and provides it to the outer SISO output unit 95.

Herein, new two decode values $\pi_0$ (c,0), $\pi_0$ (u,0) generated by the decoding operation by adapting the value $\pi_0$ (u,I) deinterleaved through the deinterleaver 93 and value it $\pi_0$ (c,I) provided from the demultiplexer 94 to the maximum probability decode algorithm are outputted to the other input terminal of the outer SISO output unit 95.

Between the generated decode values, the puncturer 96 is inputted the decode value $\pi_0$ (u,0), punctures it with the puncturing pattern, and outputs it to the interleaver 97, according to this, the interleaver 97 generates the interleaved value, namely, the probability value $\pi_1$ (u,I), and provides it to the inner SISO input unit 92.

After that, the inner SISO input unit 92, deinterleaver 93, multiplexer 94, outer SISO output unit 95, puncturer 96 and interleaver 97 perform the decoding process repeatedly.

And, in the dual mode concatenated convolutional encoder, operating as the serially concatenated convolutional decoder will now be described in detail.

First, when the substituent bit Lc on the substituted position is inputted while the demux and zero inserter 91 outputs the received code bit to the inner SISO input unit 92, the demux and zero inserter 91 transmits the bit Lc to the multiplexer 94, and outputs a code bit $\pi_1$ (c,I) generated by inserting '0' into the position to the inner SISO input unit 92.

After that, the inner SISO input unit 92 generates two code values $\pi_1$ (c,0), $\pi_1$ (u,0) by adapting the probability value $\pi_1$ (u,I) inputted to the other input terminal to the maximum probability decode algorithm, and outputs them. Between them, the code value $\pi_1$ (c,0) is non-used value, the other code value $\pi_1$ (u,0) is inputted to the deinterleaver 93, and the deinterleaver 93 deinterleaves it and outputs it.

Herein, the adjustable terminal of the first and second switch SW1, SW2 are connected to the M2 position, the output value of the deinterleaver 93 is inputted to the multiplexer 94, and the probability value $\pi_0$ (u,I) of the outer SISO output unit 95 is inputted as "0".

Accordingly, the multiplexer 94 provides the value $\pi_0$ (c,I) generated by inserting the substituent bit Lc outputted from the demux and zero inserter 91 into the code information provided from the deinterleaver 93 to the outer SISO output unit 95. In other words, the value $\pi_0$ (c,I) generated by inserting the substituent bit Lc is inserted into the position corresponding to the puncture position of the puncturer.

The new two values $\pi_0$ (c,0), $\pi_0$ (u,0) are generated by decoding the value inputted from the multiplexer 94 by adapting the zero (0) probability value $\pi_0$ (u,I) of the outer SISO output unit 95 to the maximum probability decode algorithm, and are outputted.

And, the third switch SW3 selects the value $\pi_0$ (c,0) decoded from the value $\pi_0$ (c,I) generated by inserting the substituent bit Lc, and outputs it to the puncturer 96.

When the puncturer 96 punctures the selected decoded value $\pi_0$ (c,0) with the puncturing pattern and outputs it to the interleaver 97, the interleaver 97 outputs the value found by interleaving the value punctured from the puncturer to the inner SISO input unit 92 as the probability value $\pi_1$ (u,I) of the inner SISO input unit 92.

In the dual mode convolutional encoder, when the serial concatenated convolutional decoder operates, the inner SISO input unit 92 has to operate 1.5 times faster than the outer SISO output unit 95.

As described above, when the parallel concatenated convolutional decoder and serially concatenated convolutional decoder are constructed as the one mode, in the system using the both the parallel concatenated convolutional decoder and serially concatenated convolutional decoder, the complexity of the system can be same or can be improved.

Figure 10:
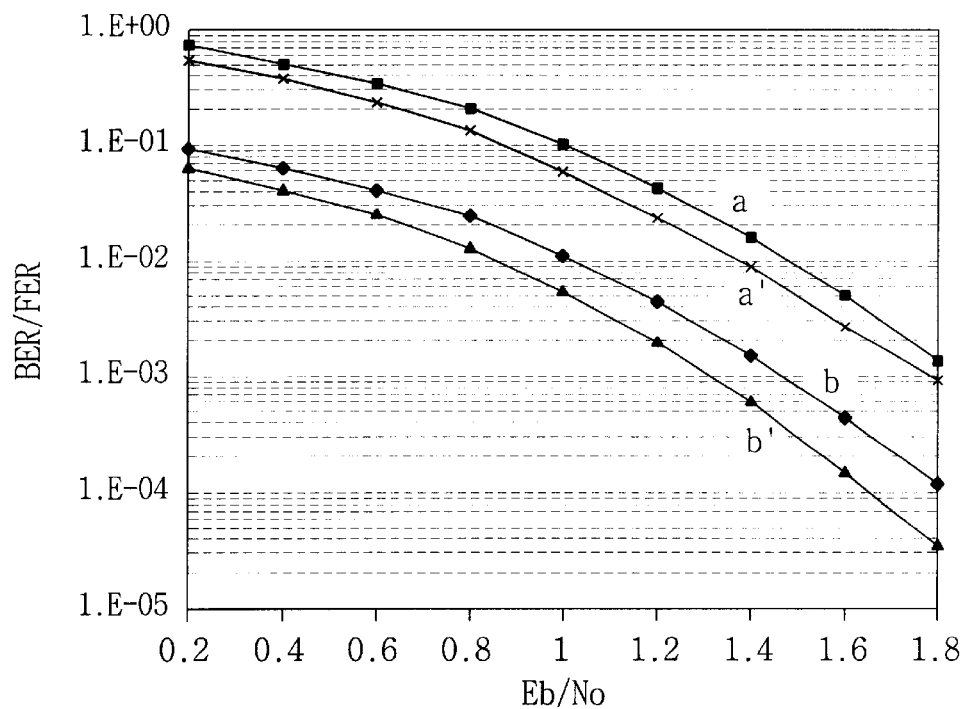
FIG. 10 is a graph illustrating experimental result of a frame error and a bit error of the conventional serially concatenated convolutional encoder of FIG. 1 and serially concatenated convolutional encoder of FIG. 4 in accordance with the present invention.

FIG. 10 is a graph illustrating experimental result of a frame error and a bit error of the conventional serially concatenated convolutional encoder of FIG. 1 and serially concatenated convolutional encoder of FIG. 4.

As depicted in FIG. 10, a and a' are graphs comparing the system performance about the frame error according to the present invention with the system performance about the frame error according to the conventional technology. Herein, a shows the conventional technology, and a' shows the present invention.

In addition, b and b' are graphs comparing the performance about the bit error according to the present invention with the performance about the bit error according to the conventional technology, it shows about 0.2 dB coding gain at the bit error $10^{-3}$ position of the present invention on the comparison with the conventional technology. Herein, b shows the conventional technology, and b' shows the present convention.

In other words, the performance of the system is getting improved as lowering as the graph position.

Figure 11:
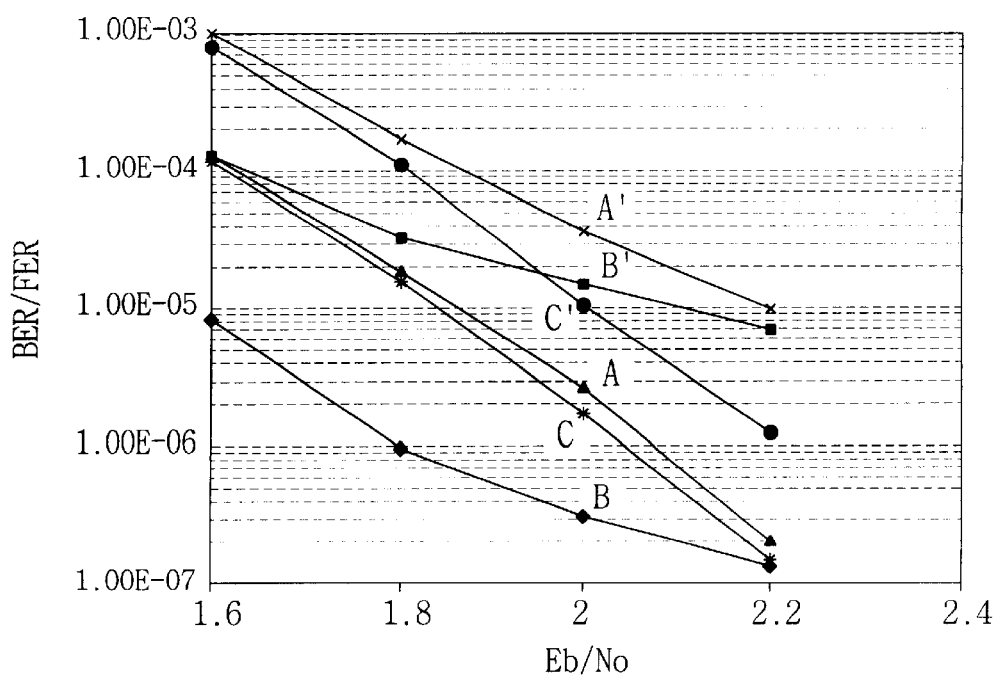
FIG. 11 illustrates the performance comparing of the frame error and bit error in the conventional serially concatenated convolutional encoder, conventional parallel concatenated convolutional encoder and serially concatenated convolutional encoder in accordance with present invention.

FIG. 11 illustrates the performance comparing of the frame error and bit error in the conventional serially concatenated convolutional, conventional parallel concatenated convolutional encoder and serially concatenated convolutional encoder in accordance with present invention. In other words, it compares the performance about the bit error and frame error of the RSC encoder having constraint length 4 of FIG. 7 with the conventional technology of FIG. 1 by connecting separately to the serially concatenated convolutional decoder, parallel concatenated convolutional decoder, serially concatenated convolutional encoder in accordance with present invention.

Herein, A and A' are graphs comparing the performance of the bit error and frame error in the connection with the serially concatenated convolutional encoder of FIG. 1.

In addition, B and B' are graphs comparing the performance of the bit error and frame error in the connection with the parallel concatenated convolutional decoder.

C and C' are graphs comparing the performance of the bit error and frame error in the connection with the serially concatenated convolutional encoder of FIG. 7 according to the present invention. The bit error probability at the bit error probability $10^{-7}$ position of the serially concatenated convolutional encoder of the present invention is similar with the parallel concatenated convolutional encoder, but the present invention is superior in the frame error probability aspect.

Herein, A, A' and B, B' illustrate the conventional technology, C, C' illustrate the present invention, and A, B, C illustrate the bit error and A', B' C' illustrate the frame error.

Figure 12:
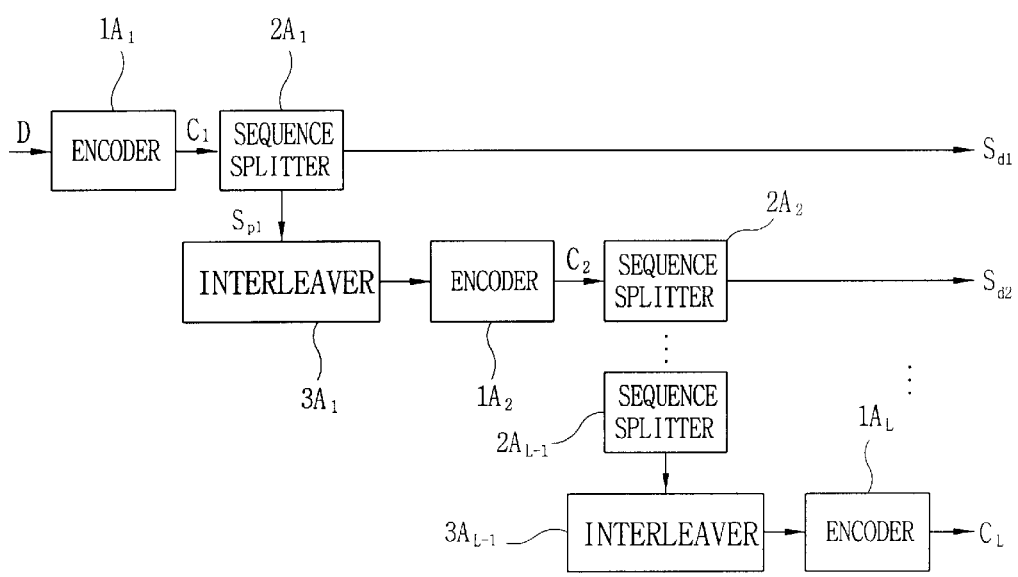
FIG. 12 illustrates the another embodiment of a concatenated convolutional encoder in accordance with the present invention

FIG. 12 illustrates the another embodiment of a concatenated convolutional encoder according to the present invention.

As depicted in FIG. 12, the another embodiment of a concatenated convolutional encoder according to the present invention comprises an encoder $1A_1$ for coding the input data and outputting it as a code word $C_1$ comprising data and parity, a sequence splitter $2A_1$ for generating a plurality of sequences having a changed variable value form by splitting the code word C1 outputted from the encoder 1A1 and transmitting one of them as the transmission sequence $S_{d1}$ as it is and providing the rest sequences to the other channel encoder as the input sequence, an interleaver $3A_1$ for relocating the sequence $S_{p1}$ inputted from the sequence splitter $2A_1$ as the random form, an encoder $1A_2$–$1A_L$, a sequence splitter $2A_2$–$2A_{L-1}$, an interleaver $3A_2$–$3A_{L-1}$ for operating as same as the encoder $1A_1$. sequence splitter $2A_1$, interleaver $3A_1$ by connecting dependently to the output terminal of the interleaver $3A_1$. Its operation will now be described with reference to FIG. 13 or FIG. 16A, 16B in detail.

First, the encoder $1A_1$ codes the input data D and outputs the coded code word $C_1$, the code word $C_1$ comprises the data and parity.

The sequence splitter $2A_1$ performs the splitting of the code word $C_1$ and generates a plurality of sequences.

The one sequence $S_{p1}$ among the plurality of sequences is relocated through the interleaver $3A_1$.

The rest sequences outputted from the sequence splitter $2A_1$ are transmitted as the transmission sequence $S_{d1}$ as it is or are used as the input sequence of the other channel decoder in case of needs.

After all, it is possible to provide the sequence $S_{p1}$ comprising the data and parity by using the sequence splitter $2A_1$ different from the conventional technology providing only the data sequence to the input terminal of the interleaver $3A_1$.

Accordingly, in the parallel convolutional encoder, the weight value of the input sequence of the second convolutional encoder can be set different with the weight value of the first convolutional encoder.

The encoder $1A_2$ codes the output sequence of the interleaver $3A_1$, the sequence splitter $2A_2$ processes the code word $C_1$ outputted form the encoder $1A_2$ with the same form of the sequence splitter $2A_1$.

Figure 13:
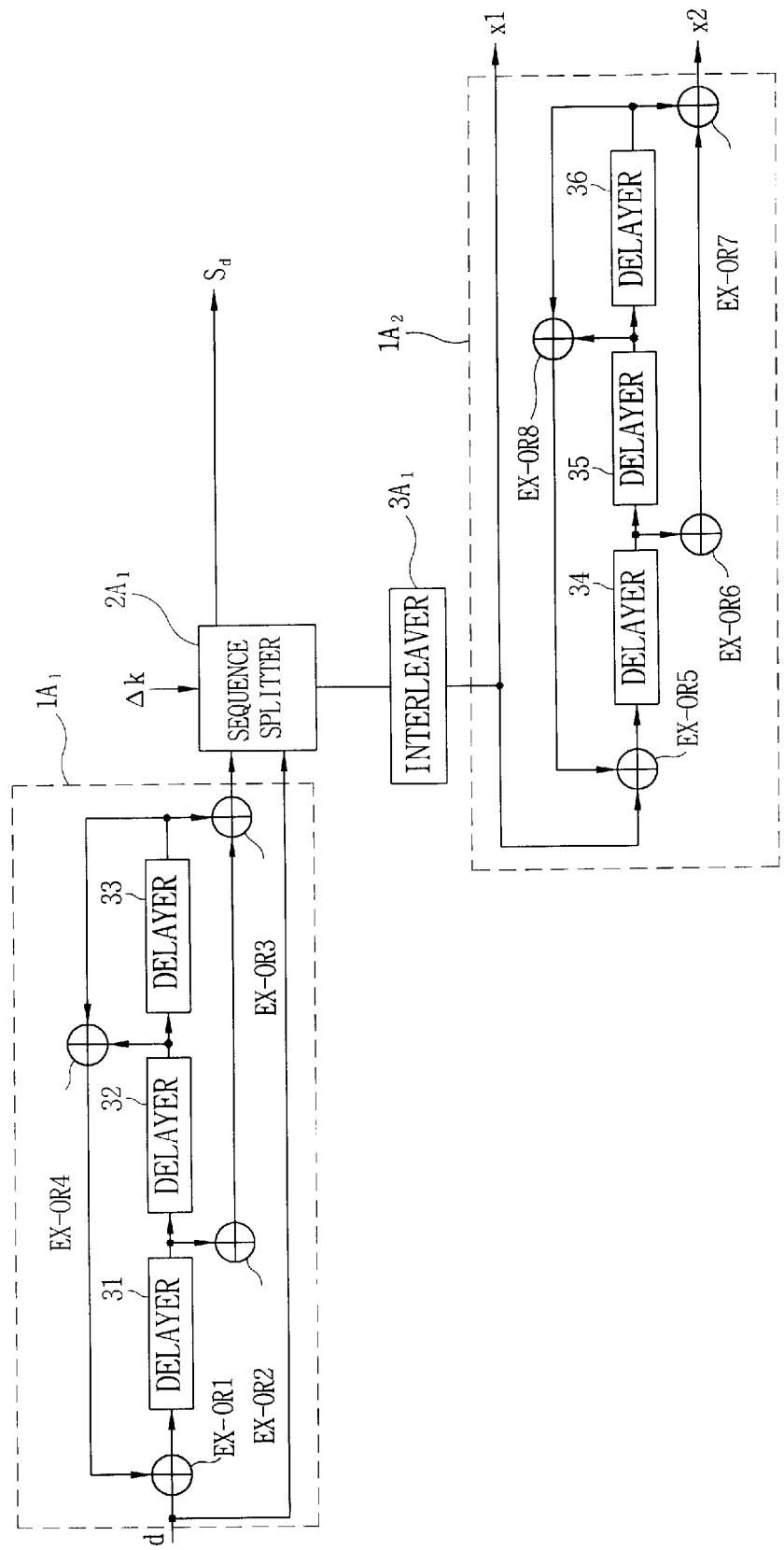
FIG. 13 is a detailed block diagram illustrating the embodiment of a concatenated encoder of FIG. 12.

FIG. 13 is a detailed block diagram illustrating the embodiment of the concatenated encoder of FIG. 12.

As depicted in FIG. 13, the embodiment of the RSC encoder is described, herein length N of the input data D sequence is 320, the constraint length of the used construction code is 4, and the code rate is ½.

Figure 14:
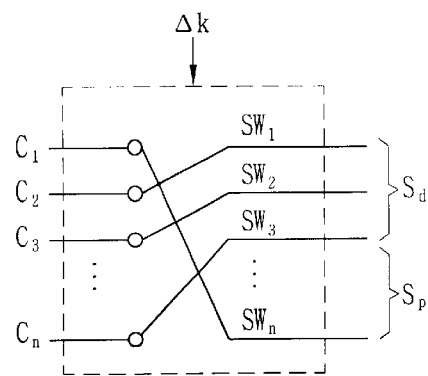
FIG. 14 illustrates the embodiment of the sequence splitter of FIG. 12 in detail.

The sequence splitter $2A_1$ generates new two sequences $S_d$, $S_p$ by using the code word outputted from the first encoder $1A_1$, for this a certain two switches among the a plurality of switches $SW_1$–$SW_n$ of FIG. 14 are used.

Herein, FIG. 14 illustrates the embodiment of the sequence splitter of FIG. 12 in detail.

Herein, the each k bit $S_d(k)$, $S_p(k)$ of the sequences satisfy the below condition.

$$S_d(K) = \{P_K^{dK}{}_{if\Delta_K = 1}{}^{if\Delta_K = 0}$$

$$S_p(K) = \{P_K^{dK}{}_{if\Delta_K = 0}{}^{if\Delta_K = 1}$$

Herein, the $\Delta_k$ is a control signal applied to the sequence splitter $2A_1$ about the k bit, the optimum control pattern in accordance with the each construction code can be designed, in the other embodiment of the present invention, when the k is an even number, the value is 0, and when the k is an odd number, the value is 1.

In the condition, 6 bits per the each convolutional code, namely, 12 bits of completion bits are added to the final code sequence in order to complete the final state of the convolutional code as the known state after coding a data sequence having a certain bit (for example: 320 bit).

The interleaver $3A_1$ relocates the sequence $S_p$ splitted by the sequence splitter $2A_1$ as the random form.

The encoder $1A_2$, sequence splitter $2A_2$ and interleaver $3A_2$ connected to the interleaver $3A_1$ operate same with the encoder $1A_1$, sequence splitter $2A_1$ and interleaver $3A_1$, and they are connected as the same form after that as occasion demands.

The channel code $S_{d1}, S_{d2}, \ldots, C_L$ processed through the above-mentioned process are modulated and transmitted to the decoder side through the communication channel, and are decoded.

Meanwhile, the decoding process after receiving the coded signal through the above-mentioned process will now be described with reference to accompanying FIG. 15.

Figure 15:
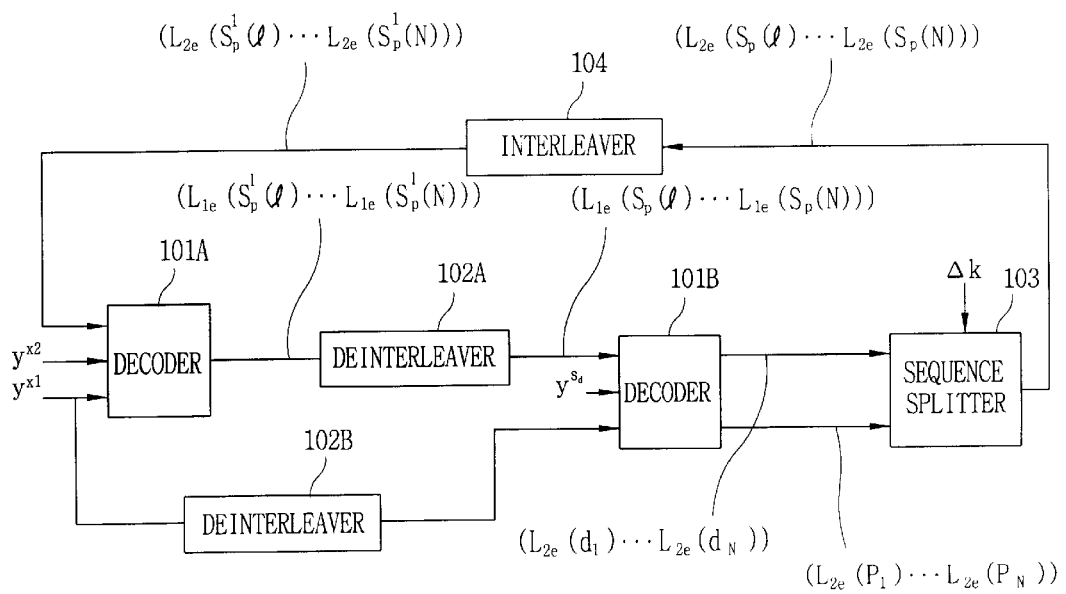
FIG. 15 is a block diagram illustrating an iterative decoder of the concatenated convolutional encoder in accordance with the present invention.

FIG. 15 is a block diagram illustrating an iterative decoder of the concatenated convolutional encoder according to the present invention.

In other words, the decoder uses the maximum probability decode algorithm having the viterbi algorithm form, and uses the iterative decode algorithm performing the iterative decode by using the soft decision output, accordingly it can show the high decoding performance.

As an example for the usable decode algorithm for the iterative decode, a MAP, Log-MAP, Max-Log-MAP, SISO can be represented.

In the decoding process, the iterative decode algorithm adapting the viterbi algorithm uses generation probability rate of the input data bit before the decoding process.

As described above, the embodiment of the decoder for performing the iterative decoding of the code generated by the decoding process with the soft dicision output value comprises two decoders 101A, 101B, a sequence splitter 103, an interleaver 104 and two deinterleavers 102A, 102B.

The decoder 101A performs the decoding after judging whether the extrinsic information is about the data or parity.

In addition, when the decoded data is outputted to the decoder 101B of the next terminal through the deinterleaver 102A, the generation probability rate having a certain bit can be calculated with the decode algorithms.

Herein, the certain bit is about the splitted sequence $S_p$ of FIG. 13, k bit $S_p(k)$ can be described as below Equation 1 or 2 as a log value.

$$L(S_p(k)) = \frac{P(S_P(K)=1)}{P(S_P(K)=0)} \quad \text{[Equation 1]}$$

$$L_{\text{LOG}}(S_p(k)) = \log\left[\frac{P(S_P(k)=1)}{P(S_P(k)=0)}\right] \quad \text{[Equation 2]}$$

In addition, the generation probability rate $L(S_p(k))$ of the certain bit described as the Equation 1, 2 or $L_{LOG}(S_P(k))$ can be modulated as below Equation 3, 4 on the decoder 101B.

$$L(S_p(k)) = \begin{cases} L(d_k) & \text{if } \Delta_k = 1 \\ L(P_k) & \text{if } \Delta_k = 0 \end{cases} \quad \text{[Equation 3]}$$

$$L_{\text{LOG}}(S_p(k)) = \begin{cases} L_{\text{LOG}}(d_k) & \text{if } \Delta_k = 1 \\ L_{\text{LOG}}(P_k) & \text{if } \Delta_k = 0 \end{cases} \quad \text{[Equation 4]}$$

Herein, the $L(d_k)$ is the generation probability rate about k bit $d_k$ of the non-decoded input sequence, $L(P_k)$ is the generation probability rate about the k parity bit $P_k$ generated in the first construction code. In addition, the each $L_{LOG}(d_k), L_{LOG}(P_k)$ is the log value about the each $L(d_k), L(P_k)$.

The generation probability rate about K bit $P_k$ and K parity bit $P_k$ about the non-decoded input sequence can be calculated on the decoder 11B by using the SISO algorithm.

In addition, the generation probability rate about the sequence $S_P$ splitted by the relation such as the Equation 3, 4 can be made, it is interleaved through the interleaver 104 and is feedback to the decoder 101A.

Figure 16A:
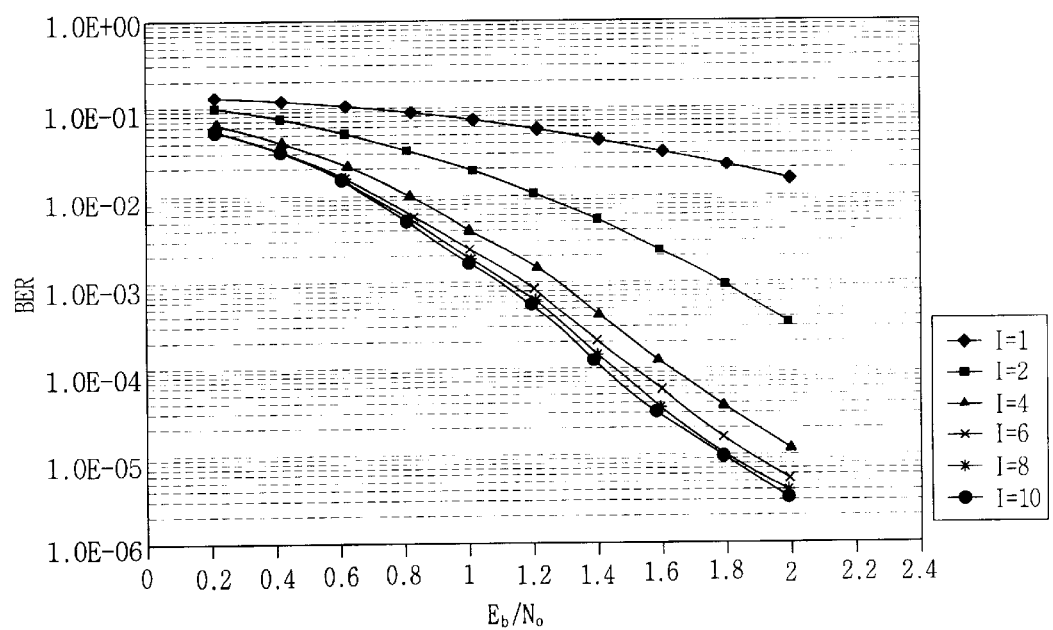
FIG. 16A is a bit error probability curve graph in accordance with iterative decode.

FIG. 16A is a bit error probability curve graph according to the iterative decode.

Figure 16B:
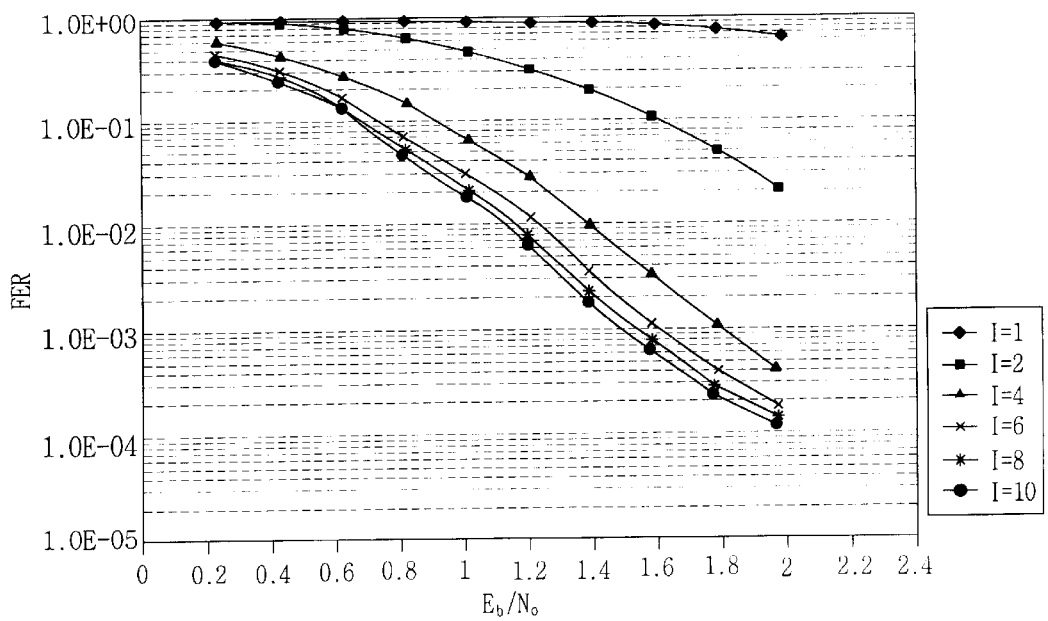
FIG. 16B is a frame error probability curve graph in accordance with iterative decode.

FIG. 16B is a frame error probability curve graph according to the iterative decode.

As described above, the performance of the system can be improved by using the sequence punctured and thrown away from the serially concatenated convolutional encoder as the input of the next terminal.

In addition, the present invention can support both the parallel concatenated convolutional encoder and serially concatenated convolutional encoder by inventing the serially concatenated convolutional encoder comprising the encoder having the same construction with the parallel concatenated convolutional encoder used in the next generation mobile communication system.

In addition, in the parallel concatenated convolutional encoder, the present invention can have the stable performance regardless of the fluctuation of the SNR by setting the weight value of the input sequence of the second convolutional encoder differentiated from the weight value of the first convolutional encoder.

In addition, the present invention can improve the credibility of the system by having the stable performance regardless of the fluctuation of the SNR.

What is claimed is:

1. A serially concatenated convolutional encoder of a mobile communication system for coding an inputted code by puncturing, comprising:
    a puncturer for puncturing the inputted code with a certain puncturing pattern;
    an interleaver for lowering correlation between adjacent codes by relocating position of the code punctured from the puncturer;
    a RSC encoder for coding the code outputted from the interleaver with 1/n code rate and outputting it;
    a delayer for delaying the inputted code punctured and thrown away from the puncturer for a certain time; and
    a substituent for substituting the punctured code delayed on the delayer for the code on the punctured position when it is inputted among the codes outputted from the RSC encoder, and outputting it.

2. The serially concatenated convolutional encoder of the mobile communication system according to claim 1, wherein the puncturer is a switch which differentiates output of a code to be outputted and the code punctured and thrown away in accordance with the puncturing pattern.

3. The serially concatenated convolutional encoder of the mobile communication system according to claim 1, wherein the substituent is a switch which differentiates output in accordance with a substituent pattern.

4. The serially concatenated convolutional encoder of the mobile communication system according to claim 1, wherein the substituent comprises:
    a multiplexer for selecting and outputting a puncture bit when the puncture bit from the delayer is inputted while selecting and outputting a coded bit outputted from the RSC encoder; and
    a second puncturer for selecting and puncturing the bit outputted from the multiplexer.

5. The serially concatenated convolutional encoder of the mobile communication system according to claim 4, wherein the second puncturer punctures the bit outputted from the multiplexer as same as the number of the bit punctured on the puncturer.

6. The serially concatenated convolutional encoder of the mobile communication system according to claim 1, wherein the code rate 1/n is ½.

* * * * *